(12) United States Patent
Loreit et al.

(10) Patent No.: US 8,957,679 B2
(45) Date of Patent: Feb. 17, 2015

(54) ASSEMBLY FOR MEASURING AT LEAST ONE COMPONENT OF A MAGNETIC FIELD

(75) Inventors: Uwe Loreit, Wetzlar (DE); Jochen Schmitt, Biedenkopf (DE)

(73) Assignee: Sensitec GmbH, Lahnau (DE)

( * ) Notice: Subject to any disclaimer, the term of this patent is extended or adjusted under 35 U.S.C. 154(b) by 592 days.

(21) Appl. No.: 13/148,647

(22) PCT Filed: Feb. 10, 2010

(86) PCT No.: PCT/EP2010/000824
§ 371 (c)(1),
(2), (4) Date: Aug. 9, 2011

(87) PCT Pub. No.: WO2010/091846
PCT Pub. Date: Aug. 19, 2010

(65) Prior Publication Data
US 2011/0309829 A1 Dec. 22, 2011

(30) Foreign Application Priority Data
Feb. 10, 2009 (DE) .......................... 10 2009 008 265

(51) Int. Cl.
| G01R 33/02 | (2006.01) |
| G01R 33/09 | (2006.01) |
| G01D 1/00 | (2006.01) |
| G01D 15/00 | (2006.01) |
| G01D 21/00 | (2006.01) |
| G01R 33/00 | (2006.01) |
| G01R 33/07 | (2006.01) |

(52) U.S. Cl.
CPC ................ G01R 33/091 (2013.01); G01D 1/00 (2013.01); G01D 15/00 (2013.01); G01D 21/00 (2013.01); G01R 33/0005 (2013.01); G01R 33/0011 (2013.01); G01R 33/0206 (2013.01); G01R 33/072 (2013.01); G01R 33/096 (2013.01)
USPC .......................................... 324/252; 324/244

(58) Field of Classification Search
USPC ................................................... 324/252, 244
See application file for complete search history.

(56) References Cited

U.S. PATENT DOCUMENTS

| 7,505,233 B2 * | 3/2009 | Grimm et al. ................. 360/321 |
| 2002/0021124 A1 | 2/2002 | Schott et al. |
| 2006/0126229 A1 | 6/2006 | Grimm et al. |
| 2007/0029998 A1 | 2/2007 | Popovic et al. |

FOREIGN PATENT DOCUMENTS

| DE | 195 32 674 C | 11/1996 |
| DE | 198 17 356 A | 10/1999 |
| DE | 199 56 361 A | 6/2000 |
| DE | 199 56 361 C | 3/2003 |
| DE | 198 30 344 C | 4/2003 |
| EP | 1 182 461 A | 7/2001 |

* cited by examiner

*Primary Examiner* — Reena Aurora
(74) *Attorney, Agent, or Firm* — DLA Piper LLP (US)

(57) ABSTRACT

The assembly for measuring at least one component (x, y, z) of an applied magnetic field (H) including a surface area made of soft-magnetic material that is applied in the chip plane and separated into two partial regions (5) by a gap (6). The gap (6) is composed of gap sections having different longitudinal directions, and magnetic field sensitive elements (2) are accommodated in one or more gap sections disposed parallel to each other. The sensitivity direction (4) of the magnetic field sensitive elements (2) and the connecting line (6") of the outer gap openings can form angles of 45° or 90°, and several surface areas can be present in the chip plane in order to completely capture all magnetic field components (x, y, z). Magnetoresistive sensor elements can advantageously be utilized as magnet-sensitive elements (2).

13 Claims, 5 Drawing Sheets

ASSEMBLY FOR MEASURING AT LEAST ONE COMPONENT OF A MAGNETIC FIELD

Figure 1:
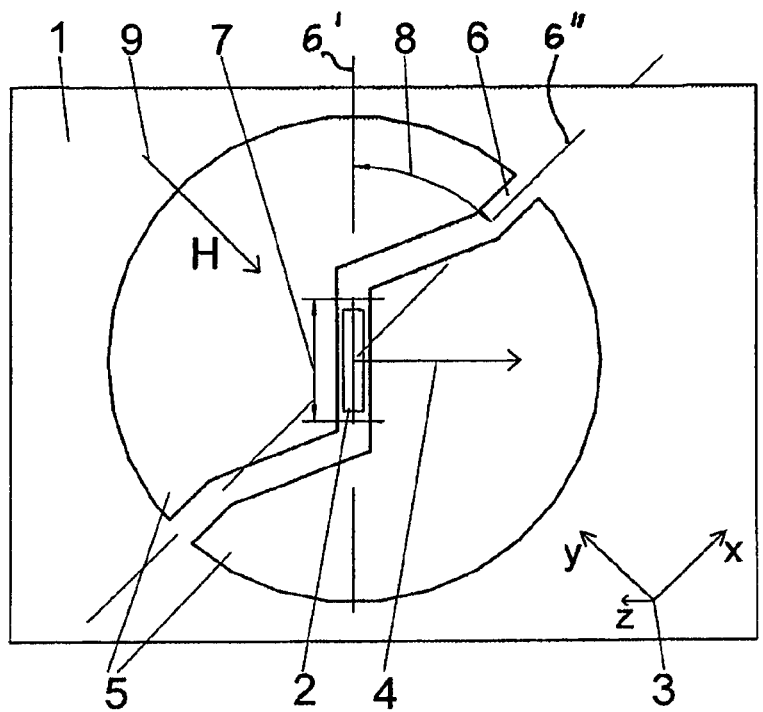

The present invention relates to assemblies for measuring one, or a plurality of, components of a magnetic field. As magnetic field sensitive measuring elements having a layered form, elements might be utilized which react to a field component in the layer plane, for instance magnetoresistive layer resistors or vertical Hall elements. The direction and the force of the influencing field components are determined by soft magnetic flux directions. The assemblies are suited for measuring magnetic fields of lower intensity such as for instance for the manufacture of an electronic compass.

Assemblies of this kind have already been known. In Laid-Open document US 2002/0021124, for instance, a sensor has been described wherein the Hall sensors are used with a magnetic field sensibility directed perpendicular to the sensor layer plane in order to determine the direction of a magnetic field extending in parallel to the sensor layer plane. The Hall sensors are disposed under a circular soft magnetic flux concentrator surface near the edge, extending in a plane in which the field direction is to be determined. Near the edge of the flux concentrator surface, field components perpendicular to the planes thereof come up particularly strongly, the direction whereof is opposite on the edges facing the circular surface. Hall sensors positioned in this location, therefore, provide output voltages of the same amount but of reversed sign. The intensity of the magnetic field in the direction of the connecting line of the two sensors can in this way be found from the difference of the two signals. The utilization of the second sensor pair with a connecting line which together with the first one establishes an angle of 90° permits in this way the determination of the relation of the field components in the plane of the flux concentrator and, thereby, of the indication of the direction of the field. Similar assemblies using a different method of finding the field direction by using a multiple of Hall sensor pairs have been suggested in Laid-Open document US 2007/0029998.

Disadvantageous of the assemblies referred to are the relatively low field sensitivity of the Hall sensors, on one hand, and the limited field increase by the flux concentrator, on the other. That is why, in spite of the favorable difference method, the obtained Hall voltages are insufficient to reach in case of the occurrence of the unavoidable offset voltages of the sensors, sufficiently small errors in the determination of the angle.

In Laid-Open publication DE 199 56 361, the utilization of multi-layer GMR ribbon resistors is described which are disposed in the gaps of a flux concentrator split up in a plurality of sectors. While the multi-layer GMR ribbon resistors have a higher field sensitivity than Hall sensors, the resistance variation thereof, nevertheless, is independent of whether the field direction is positive or negative. That is the reason why signal doubling difference measurements are not possible. The field amplifications in the gaps caused by the flux concentrator subdivided in sector shape depend on the distance to the center and on the angle relative to the field and in this way amplify the deviation from the sinusoidal shape of the signal when rotating the field, which when dealing with multi-layer GMR ribbon resistors is not the case from the very beginning. This is, however, a presumption of the evaluation.

An assembly for limiting the amplification of the field in a gap of a flux concentrator in case of high field strengths has been described in US Laid-Open publication 2006/0126229. This assembly, however, serves only for determining the field direction not, however, for measuring the amplitude of a field component.

The "NVE Corporation Catalog: Analog Sensors, Application Notes", p. 94, published in the internet describes how, based on multi-layer GMR ribbon resistors and in spite of the characteristic thereof symmetrical in the magnetic field, bridge circuits of a high magnetic field sensitivity may be realized in connection with a small temperature dependence of the output signals thereof. To this end, two GMR resistor ribbons disposed facing each other diagonally are arranged in the gap between two soft magnetic faces of a field concentrator and the two other diagonal GMR resistor ribbons below the soft-magnetic faces. In this way, the latter are no longer under the influence of the field to be measured. The reinforced outer field acts on the GMR resistor ribbons in the gap. The field amplification in the gap is approximately given by the ratio of the length extension of the flux concentrator in the field direction to the gap width if the magnetic field is directed in the longitudinal extension direction. In case of deviations of direction, increasing angles will cause larger differences relative to the sinusoidal signal pattern so that component measuring is excluded.

With a view to their high field sensitivity, spin valve GMR sensors are well suited (A. Bartos: "GMR sensors for measuring small magnetic field amplitudes". $9^{th}$ Symposium on magnetoresistive sensors and magnetic systems, 13 to 14 Mar. 2007, Wetzlar, p. 112). However, if, based on theses sensors, bridge circuits for various components of the magnetic fields have to be made, it is necessary to adjust the magnetization of the pinned layers of the spin valve layer systems for each bridge in two different directions. Since up to three components have to be measured, six adjustment directions will result. This will result in a considerable elaboration, as can for instance be taken from Laid-Open publication DE 198 30 344.

Things are made more difficult in that the spin valve layer systems the anti-ferro magnet of which can be rotated more easily simplifying the process of the adjustment of the direction of the pinned layer, are relatively instable against thermal and magnetic loads or disturbances as might occur during the course of mounting and soldering works. For stable anti-ferro magnets, economic alignment methods have as yet not been known.

It is an object of the present invention to provide an assembly for measuring at least one component of a magnetic field which can also be utilized in a compass and which makes a simple production process and a stable operation possible even under thermal and magnetic disturbances.

This task is solved by means of an assembly according to main claim 1. Advantageous embodiments are defined in the subclaims 2 to 9.

The measurement of a plurality of magnetic field components is described in claim 10, further advantageous embodiments being described in the claims following thereafter.

For the assemblies for measuring a magnetic field component, a flux concentrator is utilized consisting of a soft-magnetic surface area separated into two partial regions by a gap. This gap does not follow a straight course but is composed of several gap sections having different longitudinal directions. There is at least one gap section the longitudinal direction of which, together with the connecting line of the two points of intersection of the outer edging with the center line of the gap, forms an angle which is approximately 45° or 90°

Figure 4:
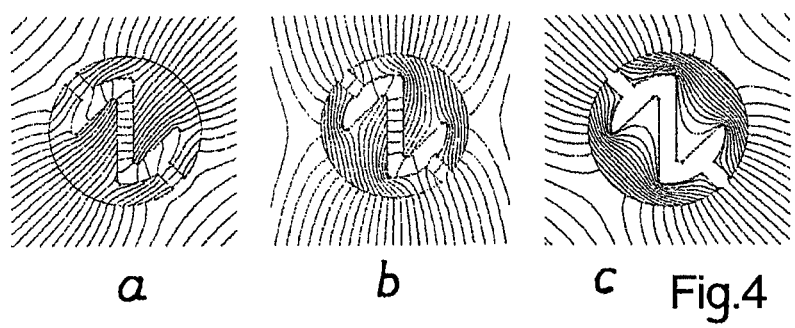

In this gap section, at least one magnetic field sensitive element is preferably disposed in the form of stripes (dimensioned considerably larger in the longitudinal direction than in cross direction). Since this magnet field sensitive element generates, by suitable prior art evaluation circuits, an image of the field to be measured, the term "measuring value forming element" will in the following also be used instead of the term "magnetic field sensitive element". Conventionally, the soft-magnetic surface areas and the magnetic field sensitive elements are applied by a thin layer process on a carrier material (silicon, ceramics and the like), this unit being referred to in the following as the sensor chip. The aforementioned magnetic field sensitive element shows a sensitivity direction in a plane parallel to the chip plane. The direction of the maximum sensitivity direction is advantageously, moreover, selected perpendicular to the receiving gap section. An external magnetic field to be measured is guided within the soft-magnetic partial sections corresponding to the magnetic conductivity of the soft-magnetic partial sections and of the gap, and in this way acts, depending on the direction of the lines of flux of the magnetic field relative to the direction of the connecting line of the two points of intersection of the gap with the outer edging of the soft-magnetic surface area, onto the magnetic field sensitive element in the gap. If the direction of the lines of flux of the external magnetic field coincides with the direction of the connecting line of the two points of intersection of the gap with the outer edging of the soft-magnetic surface area, the magnetic field in the interior of the flux concentrators will exclusively be guided in the two soft-magnetic partial sections, a transition from a soft-magnetic partial section into the other soft-magnetic partial section beyond the separating gap will not occur. If the direction of the lines of flux of the external magnetic field together with the direction of the connecting line of the two points of intersection of the gap with the outer edging of the soft-magnetic surface area establishes an angle of 90°, the complete magnetic field in the interior of the flux concentrators has to pass over the separating gap and can, in this way, be detected by the magnetic field sensitive material in the gap. For this direction of the external magnetic field, the impact on the magnetic field sensitive material is maximum, i.e. for this field direction the assembly has the maximum sensitivity. A calculation of the shape of an externally applied magnetic field in an exemplarily selected geometry of a flux concentrator according to the invention is shown in FIG. 4 for various field directions. Since the gap section in which the magnetic-field sensitive material is disposed establishes, together with the connecting line of the two points of intersection of the gap with the outer edging of the soft magnetic surface area, an angle of 45° or of 90° and the direction of the maximum sensitivity of the magnetic field sensitive material is perpendicular to the direction of the gap section, this means that the magnetic field sensitive element is most influenced if the direction of the external magnetic field and the direction of the maximum sensitivity of the magnetic field sensitive material do not, contrary to the state of the art, coincide but rather form an angle of 45° or of 90°. For an exemplified explanation of these conditions, reference is made to FIGS. 1, 2 and 9.

The gap between the two soft magnetic surface areas may advantageously be so designed that in the gap area, i.e. in the gap section in which the magnetic field sensitive element is disposed, the gap width is considerably smaller than in other gap sections. In this way, the magnetic flux portion which in this gap section passes from the one to the other soft magnetic surface area, constitutes the main portion of the magnetic flux passing on the whole gap. That is why the magnetic field intensity in this field section is substantially increased relative to the externally applied field and the direction of the field establishes, together with the longitudinal direction of the gap section an angle which deviates only insignificantly from 90°. In order to obtain an almost accurate sinusoidal dependence of the measuring values generated by the assembly on the direction of the external magnetic field, the gap width near the outer edging of the soft magnetic surface area is designed, according to an advantageous arrangement, very small wherein this small gap width, however, is selected for a small length portion of the gap only so that the stray flux overflowing here is minimized.

As the edging of the soft magnetic surface area, it is of advantage to provide a circle or a line little deviating from the circular shape in order to minimize the deviations from the sinusoidal variation of the field strength in the straight gap section with the magnetic field sensitive elements when rotating the assembly relative to the magnetic field to be measured. When designing the assembly of the invention, an almost exact symmetry structure of the surface area with the included gap sections is generally of advantage in order to obtain, when twisting the arrangement in a magnetic field to be measured, an almost optimum sinusoidal shape of the field intensity in the straight gap section. In case of a circular design of the surface area, a point symmetry also of the gap relative to the center of the circle is of particular advantage.

Figure 3:
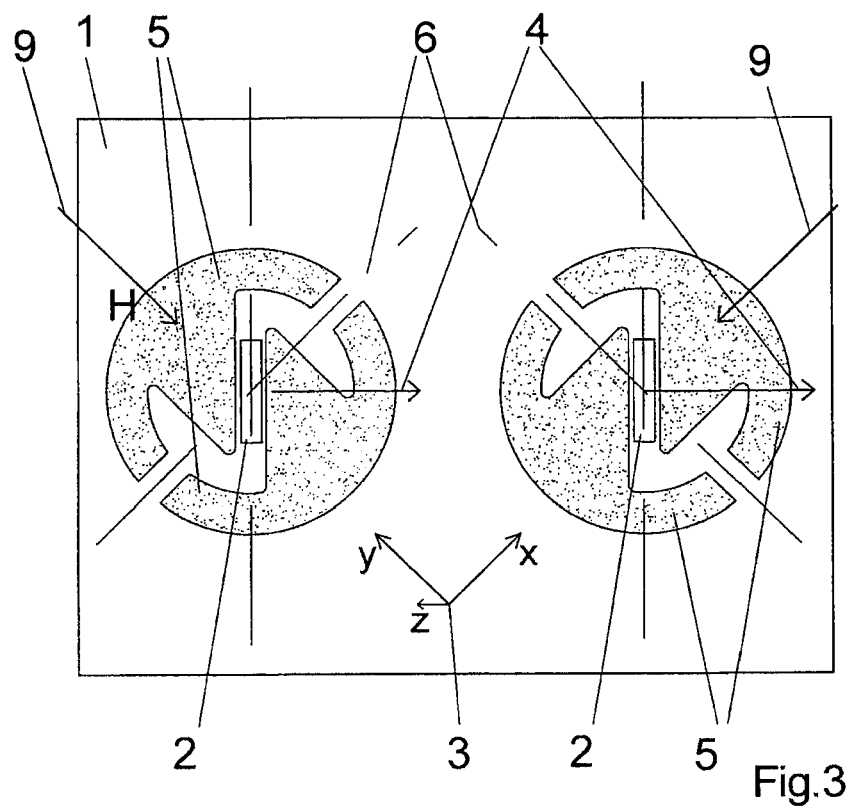

In order to detect the two components perpendicular on one plane of a magnetic field to be measured, it is furthermore of advantage to provide two surface areas having the aforementioned features on the chip wherein the two surface areas include maximum sensitivity directions twisted about 90° relative to each other. One possible embodiment in this connection is shown in FIG. 3, wherein in this case the further advantage is provided that the sensitivity directions of the magnetic field sensitive elements inserted are identical in both surface areas. For measuring all three components orthogonally disposed relative to each other of the external magnetic field, at least two further magnetic field sensitive elements are provided as a further development of the foregoing assembly having the same sensitivity direction facing each other next to a soft magnetic surface area. These two further magnetic field sensitive elements are used to capture the component of the magnetic field disposed perpendicular to the chip plane. Components of the magnetic field perpendicular to the chip plane are guided by the soft magnetic material, at least partly, in the plane of the magnetic field sensitive material wherein, at the location of the magnetic field sensitive elements, the projections of the local flux vectors into the chip plane have different signs but, ideally, identical amplitudes. For components of an external magnetic field in parallel to the chip plane, the soft magnetic material of the flux concentrator will lead to the situation that projections of the local flux vectors into the sensor plane have identical signs and nearly identical amplitudes. By difference formation of the measuring signals generated by the magnetic field sensitive elements, therefore, the components in the chip plane are suppressed while the components perpendicular thereto are imaged in an amplified manner. For an exemplified explanation, reference is made to FIGS. 5 and 6 described in the following. In the straight gap sections, in all the arrangements, magnetic field sensitive elements are arranged the sensitivity direction of which forms right angles with the longitudinal direction thereof and lies in the chip plane. With preference, magnetoresistive resistors are used for this purpose which consist of thin layer strips. It is also possible to provide a plurality of layer strips or resistors in one gap section. If resistors are used the resistance variation of which is caused by the anisotropic magnetoresistive (AMR) effect, they should, in a manner already known, be provided for the linearization of the characteristic with a barber pole structure of highly conductive layers. When using a barber pole structure with an identical angle of inclination for all AMR layer strips, half-bridge circuits of one resistor each disposed in the gap and one either above or below the soft magnetic surface areas may be provided. When using barber pole structures having opposed identical angles of inclination, the variation of the resistance in the magnetic field is countercurrent, and half-bridges may consist of two resistors disposed in a gap.

If two, or a plurality of, straight parallel gap sections are arranged, the magnetic field coming up in two gap sections disposed side by side each may be used to effect the countercurrent variation of the resistances of the half-bridges in case of an identical angle of inclination of the barber pole structure. Bridges having barber pole structures of identical inclination advantageously show smaller offset voltage values. Since the measuring arrangements of the invention for two or three field components are so designed that all magnetoresistive layer strips are in parallel and may have identical sensitivity direction, this advantage is found in all multicomponent arrangements, as well.

As magnetic field sensitive elements, layer resistors may also be used the resistance variation of which is generated by the "gigantic magnetoresistive" (GMR) effect. Preferably, spin valve layer systems are used which include a pinned layer with a fixedly adjustable magnetization direction and a free layer with a magnetization direction to be adjusted by an applied magnetic field. The resistance value of the layer varies with the angle between the two magnetization directions. In order to obtain a linear range of characteristics in the surroundings of the magnetic field zero, layer strips should be arranged in parallel to the longitudinal direction of the straight gap section and the magnetization direction of the pinned layer should be adjusted at right angles thereto. As already described in connection with the case of the utilization of AMR sensors, the soft magnetic layer areas of the invention are so shaped that half- and full-bridge arrangements having strip resistors of one single sensitivity direction can be provided. This is advantageously the case in arrangements for a one-component, two-component and three-component measurement of magnetic fields. For spin valve sensors, this is of particular significance since in this case the adjustment of the oppositely directed sensitivity would require the magnetic reversal of the pinned layer. This adjustment is elaborate and complicated, particularly in the case of pinned layers which are stable against magnetic and thermal disturbances in the assembly and in the utilization of the measuring arrangements. In the assemblies of the invention, the adjustment of the magnetization of the pinned layer may simply be made during the course of the production process. Should nevertheless a variation of this adjustment occur, the original state may again be restored by a simple temper process of the complete sensor chip in the magnetic field while no local heating up or locally different magnetic fields have to be applied.

The surface areas of soft magnetic material consist preferably of an electro-deposited iron-nickel alloy. Such layers may be produced having thicknesses of about 30 micrometers. This means that the layer thickness of the soft magnetic material is much larger than the thickness of the layer strips of the magnetoresistive resistors which is of advantage in particular for the measurement of the magnetic field component perpendicular to the chip plane.

The arrangement of field sensitive elements in neighboring parallel straight gap sections makes the elimination of measuring errors possible which come up in the individual resistors as a consequence of the slight deviation of the field direction from the cross direction.

The symmetry of the arrangements makes the production of measuring arrangements for different components with the same properties easier.

Further advantages, features and details of the invention result from the exemplified embodiments described in the following and from the drawings. The following drawings are attached:

FIG. 1 Principle of the measurement of a component of a magnetic field applied in the chip plane, as in accordance with the invention.

Figure 2:
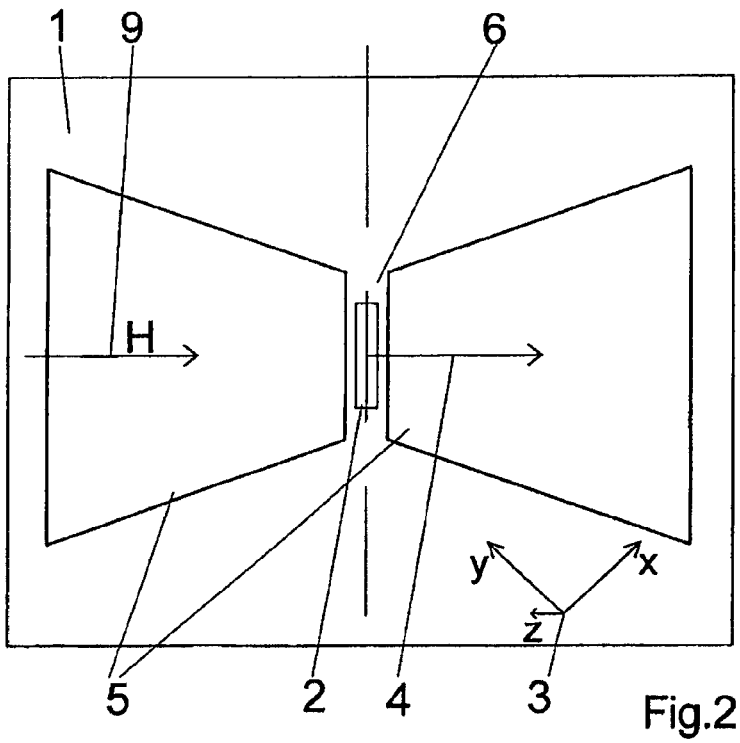

FIG. 2 Prior art concerning the capture of a component of a magnetic field applied in the chip plane by using flux guides or concentrators.

FIG. 3 Assembly of the invention for measuring two orthogonal components of a magnetic field in the chip plane.

FIG. 4 Line of flux curves in a soft magnetic surface area of the invention in case of magnetic fields of different direction.

Figure 5:
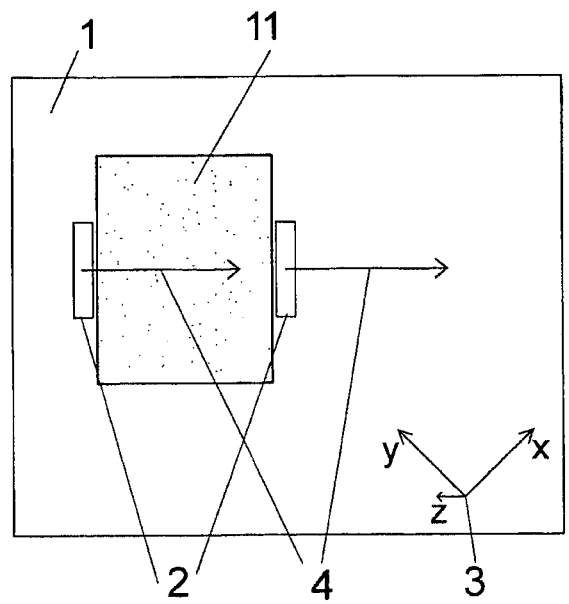

FIG. 5 Assembly for measuring the component of the magnetic field perpendicularly to the chip plane.

Figure 6:
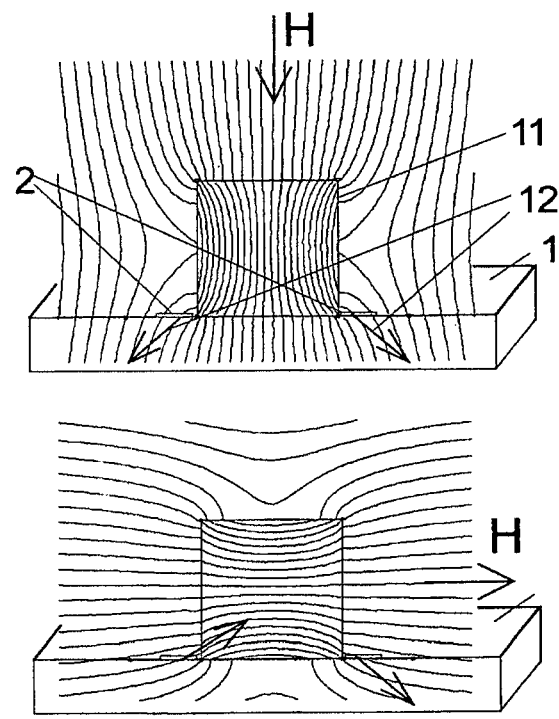

FIG. 6 Course of the magnetic line of flux on a thick soft magnetic layer having adjacent magnetic field sensitive layer strips in case of a field perpendicular and parallel to the chip plane.

Figure 7:
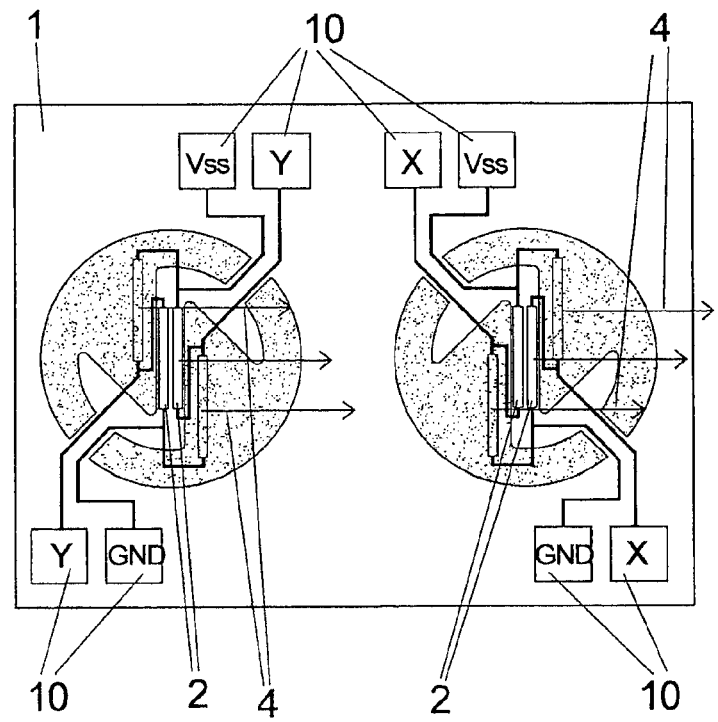

FIG. 7 Complete assembly for measuring two components of a magnetic field in the chip plane each having a magnetoresistive full-bridge.

Figure 8:
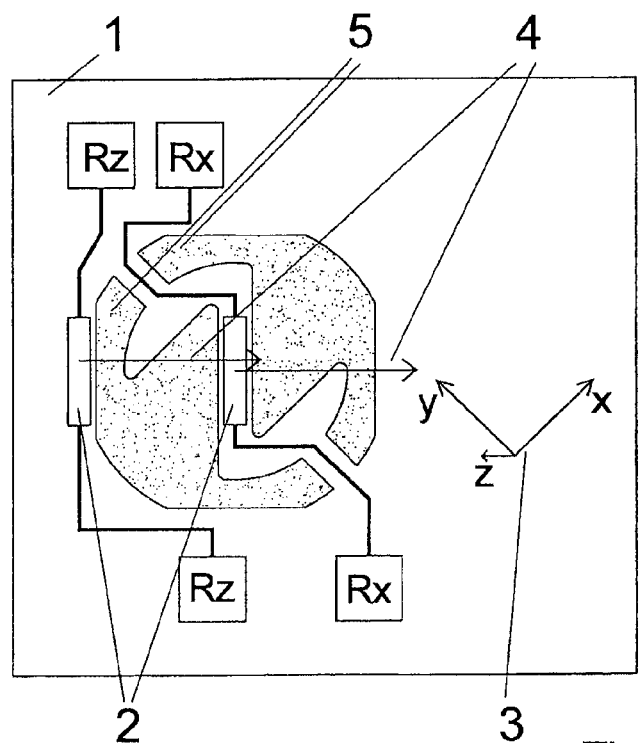

FIG. 8 Principle of measuring a field component in the chip plane and a field component perpendicular thereto.

Figure 9:
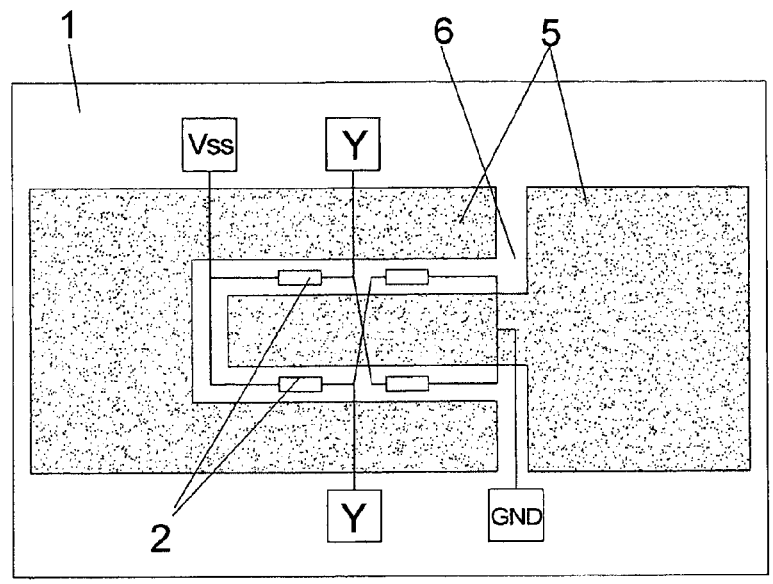

FIG. 9 Further assembly for measuring a field component by means of a full-bridge.

Figure 10:
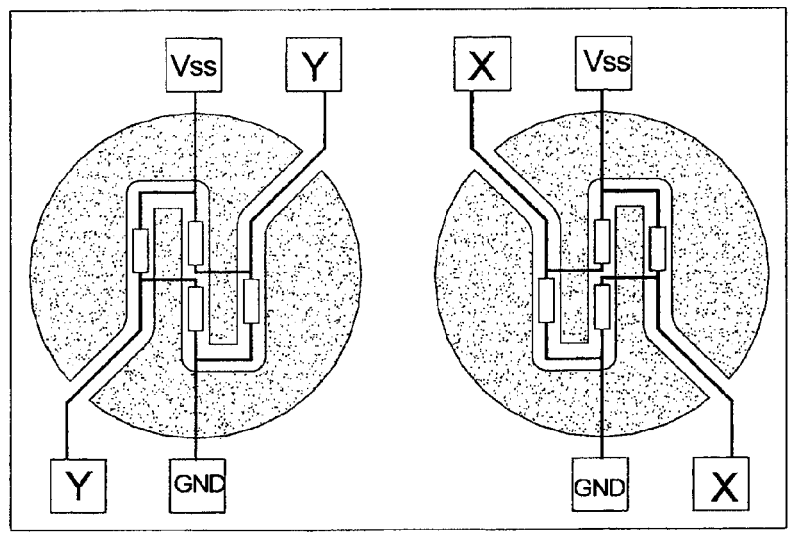

FIG. 10 Complete assembly for measuring two components of a magnetic field in the chip plane, each having a magnetoresistive full-bridge and magnetoresistive resistors in three parallel straight gap sections.

FIG. 1 shows in a diagram an exemplified assembly for measuring a magnetic field component in the plane of a sensor chip 1 by means of a magnetic field sensitive element 2. The plane of the sensor chip 1 is the x-y plane. The z plane is perpendicular to the plane of the sensor chip 1 and, in this case, is upwardly directed. An originally circular surface of soft magnetic material is separated by a gap 5 into two partial regions. The gap 6 is composed of a plurality of gap sections having directions deviating from each other. In one gap section, the magnetic field sensitive measuring element is accommodated the sensitivity direction 4 of which is perpendicular to the expansion direction of the receiving gap. The expansion direction 6' of this receiving gap section and the connecting line 6" of the two points of intersection of the gap with the original outer edging of the soft magnetic surface area form an angle 8 of 45°. The external magnetic field 9 to be measured is guided in the soft magnetic material and passes from one partial region 5 via the gap 6 into the opposite second partial region 5 and may be detected in the gap 6 by means of the magnetic field sensitive layer strip 2. This assembly exhibits particularly in the shown direction 9 the maximum sensitivity, the sensitivity direction 4 of the magnetic field sensitive layer strip having an angle of 45° relative to this direction 9. For the explanation of the maximum sensitivities in comparable assemblies of the invention, reference is made to FIG. 4. The outer edging of the assembly in FIG. 1 is approximately circular. Of advantage, in this connection, is also the point symmetry of the assembly about the center of the original circle. When turning the assembly about 360°, therefore, a sinusoidal course of the measuring value is obtained formed by the magnetic field sensitive layer strip 2.

In FIG. 2, an exemplified assembly of a flux guidance and an amplification for measuring a magnetic field according to state of the art is shown. In the gap 6 between two soft magnetic faces 5, a magnetic field sensitive element 2 is accommodated. In the present case, the gap 6 is not composed of a plurality of gap section of different direction but is rather generally straight. The sensitivity direction 4 of the magnetic field sensitive element 2 is in this case also disposed perpendicular to the longitudinal expansion of the magnetic field sensitive element 2. Caused by the total structure of the assembly as provided, however, the maximum sensitivity direction of the assembly according to direction 9 and of the sensitivity direction 4 of the magnetic field sensitive element are identical. When turning the assembly about 360°, it can be noticed that minimum and maximum sensitivity of the assembly here also are staggered about 90° each, although the measuring values generated by the element 2 do not, in view of the geometric shape of the soft magnetic partial regions 5, show a sinusoidal shape.

In FIG. 3, an exemplified assembly for detecting the two orthogonal directions in the chip plane of a magnetic field is shown. Each of the two elements having an approximately circular outer edging shows the features referred to, namely that one surface region of soft magnetic material is separated by a gap into two partial regions 5 each. The gap is in each case composed of a plurality of gap sections having different longitudinal directions. The direction of the maximum sensitivity 4 for the magnetic field sensitive elements 2 employed is identical for both elements which, production technologically, offers significant advantages. The connecting line of the two points of intersection of the outer edging with the center line of the gap 6 forms, in both elements, angles of 45° each with the longitudinal direction of the gap section accommodating the magnetic field sensitive element 2.

As compared thereto, on the other hand, the gap of the right element is disposed mirror-symmetrically relative to the gap in the left element so that the connecting line of the two points of intersection of the outer edging with the center line of the gap of the left element and the connecting line of the two points of intersection of the outer edging with the center line of the gap of the right element are disposed at a right angle to each other. Practically, this means that the two elements have maximum sensitivity directions 9 perpendicularly disposed to each other. The left element is, therefore, suited to capture the Y component and the right element is suited to capture the x component of a magnetic field acting on the assembly. The gap regions in each element have advantageously different gap widths, which particularly minimizes possible error influences because of non-desired overflowing magnetic flux beyond the magnetic field sensitive elements 2.

FIG. 4 shows, for the base structure of FIG. 3, three different constellations relative to the flux guidance in the sensor element depending on the direction of the external magnetic field. In FIG. 4a, the direction of the magnetic field and the connecting lines of the gap openings are disposed perpendicularly relative to each other. In this case, all lines of flux in the sensor element have to pass over from a soft magnetic partial region above the gap into the second soft magnetic partial region. In the region of the inner gap section in which, as an example, the magnetic field sensitive elements are accommodated, the lines of flux are disposed perpendicular to the direction of the gap region. For this constellation, the sensitivity of the sensor element is at a maximum. If the magnetic field and the connecting lines of the gap openings are disposed at an angle of 45° relative to each other (FIG. 4b), one part of the magnetic flux is conducted exclusively in the soft magnetic region and one part is primarily conducted in the region of the inner gap section above the gap between the two soft magnetic surface areas. If the external magnetic field and the connecting lines of the gap openings according to FIG. 4c have the same direction, the magnetic field is exclusively conducted in the soft magnetic regions. A passage over the gap area does not occur and magnetic field sensitive elements possibly introduced into the gap will not be influenced. In this way, the sensor element is insensitive against magnetic field components in this direction as shown.

For measuring the z component of an external magnetic field, an exemplified assembly is shown in FIG. 5. In the chip plane, a face of soft magnetic material 11 is applied at the edge of which two magnetic field sensitive elements 2 are arranged in parallel also in the X-Y plane (chip plane) with identical sensitivity means 4. The following FIG. 6 shows how the two magnetic field sensitive elements are influenced when an external magnetic field H is present. In FIG. 6a, the magnetic field acts in z direction on the assembly. In this case, caused by the flux conduction in the soft magnetic material, flux vectors 12 will come up at the location of the two magnetic field sensitive elements 2, which are symmetric relative to a plane perpendicular to the chip plane 1. The two magnetic field sensitive elements are thus influenced by the flux portions directed exactly opposed. If the magnetic field to be measured is parallel to the chip plane, two flux vectors operate at the location of the magnetic field sensitive material strips the components of which flux vectors are identically directed in the chip plane. If the material strips faithfully portray external magnetic field components in the plane as to amplitude and direction, difference evaluation will cause that magnetic field components perpendicular to the chip plane are captured whereas the magnetic field components parallel to the chip plane cancel each other after the difference formation.

In the FIGS. 1 to 6 hitherto described, the utilization of only one or of two magnetoresistive resistors for each field component has been provided. As has already been known, however, considerably better measuring results may be obtained by means of bridge circuits of such resistors. From FIG. 7, it can be taken how bridge circuits should be incorporated in the solution of the present invention. In this connection, the same flux concentrators consist of two soft magnetic surface areas each as in FIG. 3. The Wheatstone bridge for the x component of the field is assembled of four parallel magnetoresistive bridge elements. Two of the bridge elements 2 are arranged each next to the other in the straight gap section. The two other bridge elements are provided on the sensor chip 1 below the soft magnetic surface areas. The bridge elements in the gap section are exposed to the reinforced field there existing while the bridge elements under the soft magnetic surface are screened in view of the immediate nearness to it from the external field. They do not, therefore, add anything to the bridge signal and are only required for the adjustment of a small bridge offset and the small temperature dependence thereof. The structure of the bridge for the y component of the field is mirror-symmetric relative to the one described. All magnetic field sensitive directions 4 of the bridge elements are identical. The realization thereof by means of spin valve layer resistors is, therefore, advantageous again. The principle of an assembly for measuring a field component x in the plane of the sensor chip 1 and the component perpendicular thereto is shown in FIG. 8. The x component is determined, as explained above, by the magnetic field sensitive element 2 accommodated in the gap. In order to determine the x component, an additional magnetic field sensitive element 2 is used which is disposed directly at the edge of the soft magnetic region 5 and has the same magnetic field sensitive direction as the element within the gap.

FIG. 9 shows a further assembly for measuring a component of a magnetic field provided in the chip plane. In the gap sections, again, only magnetic field sensitive elements are accommodated having an identical sensitivity direction and being circuited to constitute a measuring bridge. It should be noted that contrary to the prior art described for instance in FIG. 2, the sensitivity direction 4 of the magnetic field sensitive elements and the sensitivity direction 9 of the assembly (=sensors) establish an angle of 90°.

An improvement of the sensitivity and of the measuring accuracy of the assembly may be obtained by a further improved gap geometry. In this connection, FIG. 10 shows as an example an assembly for the determination of the field components x, y in the plane of the sensor chip 1. In this case, the gap includes three parallel straight gap sections. The field direction in the gap sections, in this case, too, is at right angles to the longitudinal direction of the gap sections, it coincides in the first and the third parallel gap section and in the middle section is opposed thereto. In this way, it becomes possible to accommodate all four magnetoresistive resistors of the bridge in spite of identical characteristic and sensitivity direction within the gap and to obtain an oppositely directed resistance variation of the resistors of each half bridge. This assembly has in addition to the higher sensitivity furthermore the advantage that the influence of a magnetic field turned not exactly about 90° against the longitudinal direction of the straight gap section can be averaged out in this case. It should again be emphasized, that it is advantageous that in all embodiments described only magnetoresistive sensor elements having an identical sensitivity direction be used. When using spin valve sensors, this will make the elaborate alignment of the magnetization direction of the pinned layer of some of the sensor elements in opposed directions unnecessary. For an assembly for measuring all three field components, in addition, only such functional parts are used which can all be produced directly on a chip plane.

The invention claimed is:

1. Assembly for measuring at least one component of a magnetic field including at least one element that is provided on a sensor chip and that is magnetic field sensitive for directions in a plane of the chip, and a surface area made of soft magnetic material, characterized in that:
   the surface area made of soft magnetic material is separated by only one gap not including soft magnetic material into only two partial regions,
   the gap is composed of gap sections having a plurality of different longitudinal directions, and at least one magnetic field sensitive element is provided in the gap sections, and
   the sensitivity direction of the at least one provided magnetic field sensitive element does not coincide with the longitudinal direction of the gap section receiving it.

2. Assembly according to claim 1, characterized in that the connecting line between the outer gap openings and the sensitivity direction of the at least one magnetic field sensitive element includes an angle of approximately 45° or 90°.

3. Assembly according to claim 2, characterized in that all magnetic field sensitive elements have an identical sensitivity direction.

4. Assembly according to claim 3, characterized in that the direction of the maximum magnetic field sensitivity of the assembly does not coincide with the sensitivity direction of the magnetic field sensitive element.

5. Assembly according to claim 4, characterized in that the minimum sensitivity direction and the maximum sensitivity direction of the assembly are twisted about 90° relative to each other.

6. Assembly according to claim 1, characterized in that the surface area of the soft magnetic material has a rotational or an axial symmetry.

7. Assembly according to claim 6, characterized in that the surface area is approximately circular.

8. Assembly according to claim 7, characterized in that the magnetic field sensitive elements are magnetoresistive resistors based on the AMR, the GMR or the TMR effect.

9. Assembly according to claim 8, characterized in that a plurality of magnetic field sensitive elements are provided in the gap sections and are connected to constitute a Wheatstone bridge.

10. Assembly for measuring two magnetic field components disposed in the chip plane, particularly according to one of the foregoing claims, characterized in that:
   two surface areas of soft magnetic material are provided on the chip plane each separated in two partial sections by the only one gap not including soft magnetic material,
   the two connecting lines between two outer gap openings each include an angle of 90°, and
   magnetic field sensitive elements having an identical sensitivity direction are included in the gap sections.

11. Assembly according to claim 10, characterized in that the sensitivity direction each of the magnetic field sensitive elements and the connecting line of the respective two gap openings include an angle of approximately 45°.

12. Assembly according to claim 11, characterized in that additional magnetic field sensitive measuring elements are arranged adjacent to the at least one surface area of soft magnetic material by means of which elements of an external magnetic field which are acting perpendicularly to the sensor chip are detected.

13. Assembly according to claim 1, characterized in that additional magnetic field sensitive measuring elements are arranged adjacent to the at least one surface area of soft magnetic material by means of which elements of an external magnetic field which are acting perpendicularly to the sensor chip are detected.

* * * * *